United States Patent
Oehler et al.

(10) Patent No.: US 9,407,228 B2
(45) Date of Patent: Aug. 2, 2016

(54) RECEIVING STAGE AND METHOD FOR RECEIVING

(71) Applicant: Fraunhofer-Gesellschaft zur Foerderung der angewandten Forschung e.V., Munich (DE)

(72) Inventors: Frank Oehler, Adelsdorf (DE); Markus Eppel, Eckental (DE); Heinrich Milosiu, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/477,825

(22) Filed: Sep. 4, 2014

(65) Prior Publication Data

US 2014/0376666 A1 Dec. 25, 2014

Related U.S. Application Data

(63) Continuation of application No. PCT/EP2013/054523, filed on Mar. 6, 2013.

(60) Provisional application No. 61/607,320, filed on Mar. 6, 2012.

(51) Int. Cl.
*H04L 27/08* (2006.01)
*H03G 3/30* (2006.01)
(Continued)

(52) U.S. Cl.
CPC .............. *H03G 3/3052* (2013.01); *H04L 25/08* (2013.01); *H04L 27/06* (2013.01)

(58) Field of Classification Search
CPC .... H04B 1/709; H04B 1/7097; H04B 1/7103; H04L 7/042; H04L 27/2657; H04L 2027/0026; H04L 25/08
USPC .......... 375/142–144, 150, 152, 343, 345, 349
See application file for complete search history.

(56) References Cited

U.S. PATENT DOCUMENTS

| | | | |
|---|---|---|---|
| 3,569,953 A | | 3/1971 | Shuda et al. |
| 4,742,563 A | * | 5/1988 | Fukumura ............ H04B 7/0874 455/132 |
| 5,263,180 A | * | 11/1993 | Hirayama et al. ............ 455/139 |

(Continued)

FOREIGN PATENT DOCUMENTS

| | | |
|---|---|---|
| EP | 0448071 | 9/1991 |
| EP | 1598945 | 11/2005 |

(Continued)

*Primary Examiner* — Emmanuel Bayard
(74) *Attorney, Agent, or Firm* — Michael A. Glenn; Perkins Coie LLP

(57) ABSTRACT

A receiver stage for receiving a receive signal comprises M receiving paths, each receiving path comprises a signal processor and K comparators. The signal processors of the M receiving paths are configured to generate, for each of the M receiving paths, an amplified version of the receive signal, such that an amplification gain of the respective receiving path increases from a first of the M receiving paths to a last of the M receiving paths. For each of the M receiving paths the K comparators of the respective receiving paths are configured to compare the amplified receive signal of the respective receiving path with a respective threshold value. For each of the M receiving paths the threshold value increases from a first of the K comparators to the last of the K comparators.

22 Claims, 5 Drawing Sheets

(51) Int. Cl.
*H04L 25/08* (2006.01)
*H04L 27/06* (2006.01)

(56) References Cited

U.S. PATENT DOCUMENTS

| | | | | |
|---|---|---|---|---|
| 5,291,519 | A * | 3/1994 | Tsurumaru | 375/230 |
| 5,742,896 | A * | 4/1998 | Bose | H04B 7/0888 455/133 |
| 5,918,164 | A * | 6/1999 | Takahashi | H04B 7/082 455/134 |
| 5,937,005 | A * | 8/1999 | Obuchi et al. | 375/224 |
| 6,088,583 | A * | 7/2000 | Shimizu et al. | 455/235.1 |
| 6,137,824 | A * | 10/2000 | Liu | 375/130 |
| 6,191,725 | B1 | 2/2001 | Lavoie | |
| 6,445,246 | B1 * | 9/2002 | Yoshida | H03K 5/007 329/300 |
| 6,560,299 | B1 | 5/2003 | Strolle et al. | |
| 6,763,056 | B1 * | 7/2004 | Ohsuge | 375/140 |
| 6,847,628 | B1 | 1/2005 | Sakuma | |
| 6,944,243 | B2 * | 9/2005 | Ohtaki et al. | 375/347 |
| 6,963,733 | B2 * | 11/2005 | Eriksson et al. | 455/132 |
| 7,245,894 | B2 * | 7/2007 | Sekiguchi et al. | 455/242.1 |
| 7,310,503 | B2 * | 12/2007 | Ido | 455/140 |
| 7,463,704 | B1 | 12/2008 | Tehrani et al. | |
| 7,729,413 | B2 * | 6/2010 | Kohli et al. | 375/150 |
| 7,787,841 | B2 * | 8/2010 | Tsukio et al. | 455/138 |
| 7,818,635 | B2 * | 10/2010 | Tsukio et al. | 714/708 |
| 7,853,224 | B2 * | 12/2010 | Exeter | H03G 3/3052 455/136 |
| 8,385,486 | B2 * | 2/2013 | Soga et al. | 375/347 |
| 8,847,757 | B2 * | 9/2014 | Kim et al. | 340/556 |
| 2005/0113143 | A1 * | 5/2005 | Oiwa | 455/562.1 |
| 2006/0165199 | A1 * | 7/2006 | Takemoto et al. | 375/347 |
| 2007/0176777 | A1 * | 8/2007 | Reime | G01V 8/20 340/545.3 |
| 2008/0297661 | A1 * | 12/2008 | Kitaguchi | H04B 1/28 348/705 |
| 2009/0060106 | A1 * | 3/2009 | Kuramoto | 375/347 |
| 2009/0261881 | A1 * | 10/2009 | Iraha | H03F 3/19 327/307 |
| 2010/0141389 | A1 | 6/2010 | Hagl et al. | |
| 2010/0321289 | A1 * | 12/2010 | Kim et al. | 345/156 |

FOREIGN PATENT DOCUMENTS

| | | |
|---|---|---|
| EP | 1804414 | 7/2007 |
| GB | 2148638 | 5/1985 |

* cited by examiner

RECEIVING STAGE AND METHOD FOR RECEIVING

CROSS-REFERENCE TO RELATED APPLICATIONS

This application is a continuation of copending International Application No. PCT/EP2013/054523, filed Mar. 6, 2013, which claims priority from U.S. Provisional Application No. 61/607,320, filed Mar. 6, 2012, each of which is incorporated herein in its entirety by this reference thereto.

BACKGROUND OF THE INVENTION

Embodiments of the present invention refer to a receiving stage for receiving a receive signal and to a method for receiving a receive signal.

A receiving stage is typically included by a receiver, e.g. a communication receiver or radio receiver. All types of radio receivers have the purpose of converting the information carried by the radio waves to a useable form, e.g. an audio signal or a (digital) data signal. Such wireless receivers are typically coupled to an antenna for receiving the electromagnetic wave or the RF signal (radio frequency signal).

The receiver typically comprises a receiving stage and a mixing stage arranged between the receiving stage and the antenna. The mixer stage has the purpose of performing a downmixing of the RF signal and to output an IF signal (intermediate frequency signal) to the receiving stage. The receiving stage may comprise an amplifier for increasing the IF signal amplitude and a demodulator for recovering the desired information, for example a bit sequence, based on the IF signal.

Typically the amplifier is adjustable in order to provide different amplification gains so that a weak signal, sent by a transmitter having a long distance, is more strongly amplified when compared to a strong signal, sent by a transmitter having a small distance. A state of the art approach for adjusting the amplification gain is to provide a so called automatic gain control (AGC) which is configured to adapt the gain of the amplifier as long as the signal output by the amplifier is out of a predetermined signal strength. However, the adjustment of the amplification gain by using the automatic gain control takes time. Therefore, it cannot be guaranteed that a short signal sequence (short data telegram) may be received especially in case of signal strength changes (strong to weak or vice versa). In other words, a short data telegram could be missed. Thus, a repeated transmission of the telegram is necessitated. Thus, there is the need for an improved approach.

SUMMARY

According to an embodiment, a receiving stage for receiving a receive signal may have: M receiving paths, each receiving path including a signal processor and K comparators, wherein the signal processors of the M receiving paths are configured to generate, for each of the M receiving paths, an amplified version of the receive signal such that an amplification gain of the respective receiving path increases from a first of the M receiving paths to a last of the M receiving paths, wherein for each of the M receiving paths the K comparators of the respective receiving paths are configured to compare the amplified receive signal of the respective receiving path with a respective threshold value, and for each of the M receiving paths the threshold value increases from a first of the K comparators to the last of the K comparators.

According to another embodiment, a method for receiving a receive signal, using the receiving stage including M receiving paths, each receiving path includes a signal processor and K comparators, may have the steps of: generating an amplified version of the receive signal for each of the M receiving paths, using the respective signal processor of the average receiving path, such that an amplification gain of the respective receiving paths increases from a first of the averaging path to a last of the receiving paths; and comparing the amplified receive signal of the respective receiving paths with a respective threshold value for each of the M receiving paths, using the K comparators of the respective receiving paths, wherein for each of the receiving paths the threshold value increases from a first of the K comparators to a last of the K comparators.

An embodiment of the present invention provides a receiving stage for receiving a receive signal, e.g. an IF signal. The receiving stage comprises M receiving paths, wherein each receiving path comprises a signal processor and K comparators. The signal processors of the M receiving paths are configured to generate, for each of the M receiving paths, an amplified version of the receive signal such that an amplification gain of the respective receiving path increases from a first of the M receiving paths to a last of the M receiving paths. For each of the M receiving paths the K comparators of the respective receiving paths are configured to compare the amplified receive signal of the respective receiving path with a respective threshold value. For each of the M receiving paths the threshold value increases from a first of the K comparators to a last of the K comparators.

Teachings of the present invention are based on recognizing that the adjustment of the amplification gain may become needless when the evaluation of the receive signal is performed in parallel receiving paths, wherein in each receiving path a version of the same signal amplified according different amplification gains (e.g. by different amplifiers having different gain) is evaluated. Consequently a receive signal having a weak signal strength is processed in a receiving path having a high amplification gain, wherein a receive signal having a strong signal strength is processed in a further receiving path having a low amplification gain. Thus, receive signals having different signal strengths may be received without any delay caused by the gain control in a manner enabling immediate processing. The processing of the receive signal may include evaluating the amplified receive signal, so each receiving path comprises besides the signal processor (e.g. amplifier), K comparators which are configured to compare the receive signal with respective (different) threshold values in order to output a bit sequence. The use of a plurality of M (parallel) receiving paths with distinct discrete nonadjustable gain stages, and K comparator paths each using a different threshold value, leads to a wider input dynamic range.

In case of applying the described principal to an ASK receiver, the receiving stage may have a high input dynamic range and a quick response to dynamic changes of the desired signal, wherein the risk of missing telegrams is reduced due to the time advantages. In the case of OOK modulation of the receive signal, the higher input dynamic range improves the immunity against interference, while keeping the time advantage compared to state of the art AGCs.

To sum up, a receiving stage having a high input dynamic range is formed due to the combination of the plurality of receiving paths (M receiving paths) and the plurality of comparators, wherein the dynamic range depends on the number of receiving paths (M) and on the number of comparators (K)

and thus on the product M×K. Therefore, the receiving stage may be described by an M×K matrix (e.g. a 4×3 matrix).

This M×K matrix may have two different variations. According to a first embodiment the receiving paths are received in parallel. Here, the different amplification gains for the K receiving paths are generated by using different amplifiers having different gains so that in each of the M paths a different amplification gain is used.

According to a further embodiment, the amplifiers of the M signal processors comprising the amplifiers may be arranged in series, wherein the M comparator arrangements comprising the K comparators may be arranged in parallel. Thus, the amplification gain is graded from signal processor to signal processor due to the fact that a receive signal may be amplified several times, with the exception of the receive signal amplified for the first receiving path. According to another embodiment, the respective gains of the respective amplifiers may be equal.

According to a further embodiment, each signal processor may comprise an amplifier and a demodulator arranged between the amplifier and the comparator arrangement. The demodulator may be configured to demodulate the IF signal, for example based on a power detection or an envelope detection.

According to a further embodiment, each of the K comparators may be coupled to a correlator configured to detect a bit sequence forwarded by the respective comparator. According to further embodiments the plurality of M×K comparators or correlators may be coupled to a digital selector configured to select or process (e.g. by means of combinational logic) one or multiples of the M×K channels via which the bit sequence is received.

BRIEF DESCRIPTION OF THE DRAWINGS

Embodiments of the present invention will be detailed subsequently referring to the appended drawings, in which.

DETAILED DESCRIPTION OF THE INVENTION

Different embodiments of the present invention will subsequently be discussed referring to FIGS. 1 to 3. In advance, identical reference numbers are provided to objects having identical or similar functions so that objects referred to by identical reference numbers within the different embodiments are interchangeable and the description thereof is mutually applicable.

Figure 1:
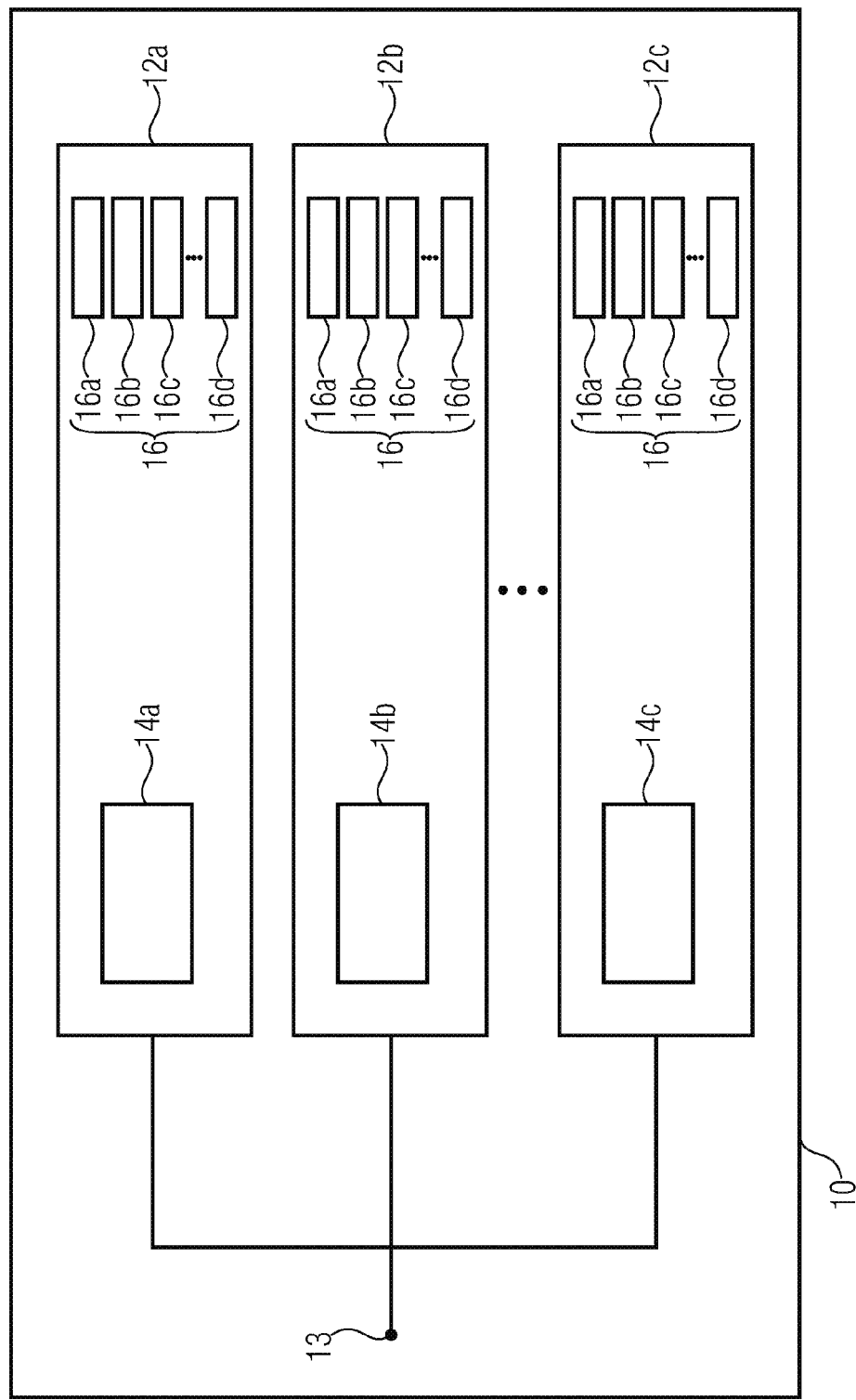
FIG. 1 shows a schematic block diagram of a receiving stage according to an embodiment.

FIG. 1 shows a receiving stage 10 comprising M receiving paths 12*a*, 12*b* and 12*c* (M branches), wherein each receiving paths comprises a signal processor 14*a*, 14*b* and 14*c* and K comparators 16*a*, 16*b*, 16*c* and 16*d* (K subbranches). The M receiving paths 12*a*, 12*b* and 12*c* are coupled to each other, for example via a common node 13, at the input side in order to receive the same receive signal (IF signal), for example from a mixing stage.

This receive signal is processed or amplified by each of the signal processors 14*a*, 14*b* and 14*c* and output to the respective comparator arrangement 16 of the respective receiving path 12*a*, 12*b* and 12*c*, each comparator arrangement 16 comprising a plurality of comparators 16*a*, 16*b*, 16*c* and 16*d*. The comparators 16*a*, 16*b*, 16*c* and 16*d* are configured to compare the amplified receive signal of the respective receiving path 12*a*, 12*b* or 12*c* with a respective threshold value. The comparator arrangements 16 of the M receiving paths 12*a*-12*c* are typically equal, wherein the K comparators 16*a*, 16*b*, 16*c* and 16*d* within a respective receiving path 12*a*, 12*b* or 12*c* differ from each other with regard to their threshold values. The threshold values of the K comparators 16*a*, 16*b*, 16*c* and 16*d* are selected such that the threshold value increases from a first of the K comparators 16*a* to a last of the K comparators 16*d*.

Each comparator 16*a*, 16*b*, 16*c* and 16*d* is configured to output a binary signal, e.g. a "1", if the amplified receive signal is above the respective threshold value, and a "0" if the amplified receive signal is below the respective threshold value. I.e. that the comparator is configured to output a digital signal based on an analog signal on the condition that the amplified receive signal oscillates around the respective threshold value. In detail, this means that the amplified receive signal has an off-level (lower value, e.g. −80 dBV) and an on-level (higher value, e.g. −70 dBV).

While embodiments according to FIG. 1 may be applied to a ASK (amplitude shift key) modulated receive signal, resulting in high input dynamic range without the time requirements of an automatic gain control, the embodiments of FIGS. 2*a* and 2*b* will benefit the receivers interferer immunity if the desired receive signal is modulated with OOK modulation, which is more thoroughly explained in the following.

As a desired receive signal and an interferer signal are not coherent in general, in the following exemplary calculations, the signal levels are added as power levels, as shown by the following table:

TABLE 1

| Desired signal level | Interferer level | Total effective level (effective IF signal for data) |
|---|---|---|
| −70 dBV | −70 dBV | −67 dBV |
| −70 dBV | −80 dBV | −69.6 dBV |

From this it may be concluded that a conversion of the receive signal into a digital signal may be able if the off-level and interferer level, respectively, is below one of the respective threshold values of the K comparators 16*a* to 16*d* and if the effective IF signal is above a respective threshold value of the respective comparator 16*a* to 16*d*, at times where the desired receive signal comprises a logical high state.

As indicated by the reference numerals the signal processors 14*a*, 14*b* and 14*c*, which typically comprise amplifiers, of the M receiving paths may differ from each other. In general, the different amplifiers and signal processors 14*a*, 14*b* and 14*c*, respectively, are configured to generate, for each of the M receiving paths 12*a*, 12*b* and 12*c*, an amplified version of the receive signal such that an amplification gain of the respective receiving path 12*a*, 12*b* or 12*c* increases from a first of the M receiving paths 12*a* to a last of the M receiving paths 12*c*.

Due to the combination of the M receiving paths 12a to 12c and the K comparators 16a to 16d effective comparator thresholds (referred to as the IF level of the received receive signal) are generated which increase from the first comparator 16a of the first receiving path 12a to the last comparator 16d of the last signal path 12c. I.e. the receive signal may be processed or evaluated by M×K comparators, using M×K (effective comparator) thresholds, in parallel. This mode of operation of the receiving stage 10 formed by an M×K matrix will be discussed below.

The discussion is made based on exemplary values for the amplification gain of the three signal processors 14a, 14b and 14c and for the threshold values of the comparators 16a, 16b, 16c and 16d. The exemplary amplification gain of the three signal processors 14a, 14b and 14c are 20 dB (14a), 30 dB (14b) and 40 dB (14c), wherein the exemplary threshold values of the four comparators 16a, 16b, 16c and 16d are −21 dBV (16a), −24 dBV (16b), −27 dBV (16c) and −30 dBV (16d). The resulting exemplary values of effective comparator thresholds are shown by the following table:

TABLE 2

| | Comparator M.K | | | | | | | | | | | |
|---|---|---|---|---|---|---|---|---|---|---|---|---|
| | 3.4 | 3.3 | 3.2 | 3.1 | 2.4 | 2.3 | 2.2 | 2.1 | 1.4 | 1.3 | 1.2 | 1.1 |
| IF input level [dBV] | −70 | −67 | −64 | −61 | −60 | −57 | −54 | −51 | −50 | −47 | −44 | −41 |

Based on these effective comparator thresholds the conversion of an OOK modulated receive signal into the binary signal may be performed as illustrated by the following table.

TABLE 3

| data modulated desired IF signal [dBV] | CW interferer signal [dBV] | effective IF signal [dBV] for data = 1 | simple OOK output (>−60 dBm) | Comparator outputs (1 for CW, D for data) | | | | | | | | | | | |
|---|---|---|---|---|---|---|---|---|---|---|---|---|---|---|---|
| | | | | 3.4 | 3.3 | 3.2 | 3.1 | 2.4 | 2.3 | 2.2 | 2.1 | 1.4 | 1.3 | 1.2 | 1.1 |
| −40 | −30 | −29.6 | 1 | 1 | 1 | 1 | 1 | 1 | 1 | 1 | 1 | 1 | 1 | 1 | 1 |
| −40 | −40 | −37 | 1 | 1 | 1 | 1 | 1 | 1 | 1 | 1 | 1 | 1 | 1 | 1 | 1 |
| −40 | −50 | −39.6 | 1 | 1 | 1 | 1 | 1 | 1 | 1 | 1 | 1 | 1 | D | D | D |
| −50 | −40 | −39.6 | 1 | 1 | 1 | 1 | 1 | 1 | 1 | 1 | 1 | 1 | 1 | 1 | 1 |
| −50 | −50 | −47 | 1 | 1 | 1 | 1 | 1 | 1 | 1 | 1 | 1 | D | 0 | 0 | 0 |
| −50 | −60 | −49.6 | 1 | 1 | 1 | 1 | 1 | 1 | D | D | D | D | 0 | 0 | 0 |
| −60 | −50 | −49.6 | 1 | 1 | 1 | 1 | 1 | 1 | 1 | 1 | 1 | 0 | 0 | 0 | 0 |
| −60 | −60 | −57 | 1 | 1 | 1 | 1 | 1 | D | 0 | 0 | 0 | 0 | 0 | 0 | 0 |
| −60 | −70 | −59.6 | D | 1 | D | D | D | 0 | 0 | 0 | 0 | 0 | 0 | 0 | 0 |
| −70 | −60 | −59.6 | 1 | 1 | 1 | 1 | 1 | 0 | 0 | 0 | 0 | 0 | 0 | 0 | 0 |
| −70 | −70 | −67 | 0 | D | D | 0 | 0 | 0 | 0 | 0 | 0 | 0 | 0 | 0 | 0 |
| −70 | −80 | −69.6 | 0 | D | 0 | 0 | 0 | 0 | 0 | 0 | 0 | 0 | 0 | 0 | 0 |

The table 3 comprises for different receiving scenarios values for a data signal, for a continuous wave interferer signal and the resulting effective IF signal. Furthermore, the table comprises for each of the M×K comparators of the receiving stage 10 a respective output value for each receiving scenario. Here "0" means that the effective IF signal in the given scenario is below the effective comparator threshold at all (relevant) times, and wherein "1" means that effective IF signal is above the respective comparator thresholds at all (relevant) times. The case in which the continuous wave interferer signal is below the respective effective comparator threshold and the resulting effective IF signal at times where data=1 is above the respective effective comparator threshold is marked by a "D", implying a data stream and that data receiving or outputting of a desired bit sequence is possible.

As can be seen from the table, some scenarios will lead to an unable receiving (cf. line data signal −50 dBV, CW signal −40 dBV, effective IF signal −39.6 dBV, wherein some scenarios will lead to a reception via one or even more comparators (cf. line data signal −50 dBV, CW signal −60 dBV, effective IF signal −49.6 dBV). For comparative purposes the table comprises a further column illustrating the comparator output of a simple OOK (On-Off Keying) comparator according to the state of the art. As can be seen, the receiver 10 extends the necessitated signal to interferer ratio by allowing higher interferer levels. The topology allows a continuous signal reception without delays from the automatic gain control. Wireless receivers for a frequency bands with much radio traffic benefit from the receiving stage 10 and get a higher interferer and blocking tolerance within the radio channel, i.e. smaller input signal-to-interferer ratio is possible. Moreover, the probability of detecting the desired radio signal is increased.

Figure 2A:
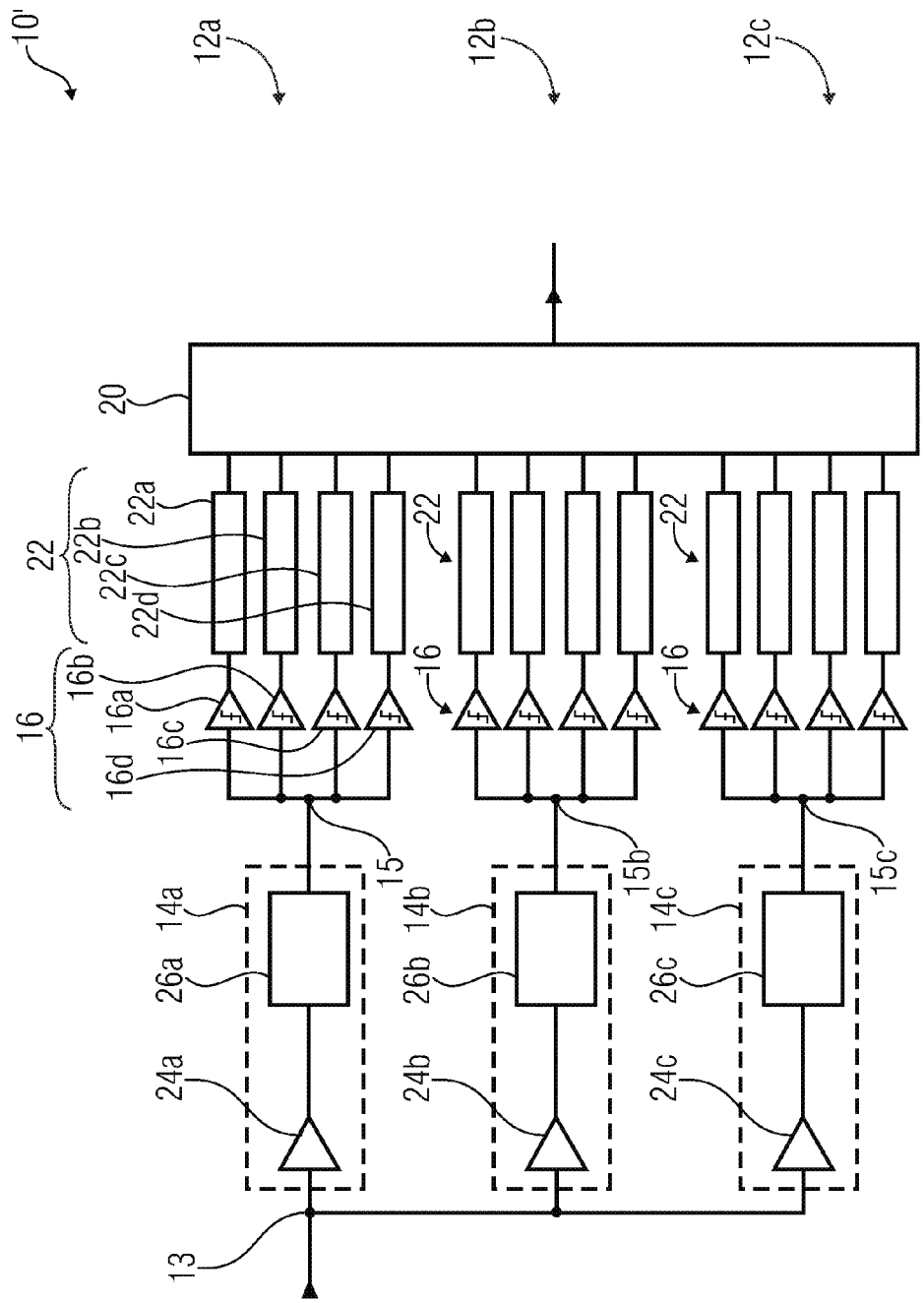
FIG. 2*a* shows a block diagram of a receiving stage according to a further embodiment, wherein the M receiving paths are arranged in parallel.

FIG. 2a shows a further implementation of the receiving stage 10' comprising the M receiving paths 12a, 12b, 12c, wherein the receiving paths 12a, 12b and 12c are arranged in parallel to each other so that each of the signal processors 14a, 14b and 14c are directly coupled to the common node 13. Each receiving path 12a, 12b and 12c comprises the respective signal processor 14a, 14b and 14c and the comparator arrangement 16, wherein the comparator paths 16a, 16b, 16c and 16d are arranged in parallel and coupled to further respective common nodes 15a, 15b and 15c.

Each of the signal processors 14a, 14b and 14c is formed by a combination of an amplifier 24a, 24b and 24c with a demodulator 26a, 26b and 26c. In this embodiment the amplifiers 24a, 24b and 24c have different gains in order to provide different amplification gains at the output of the signal processor 14a, 14b and 14c. Consequently, the receive signal is amplified differently. The amplified receive signal may, for example, be an amplitude modulated signal or another alternating signal which has to be demodulated before provided to the comparator paths 16a, 16b, 16c and 16d.

The demodulation is performed by respective demodulators 26a, 26b and 26c. The demodulators 26a, 26b and 26c may, for example, be formed by a peak detector, power detector or an envelope detector. Alternatively, the demodulators 26a, 26b and 26c may comprise another detector for demodulating an amplitude modulator signal or, in general, detector which is configured to an output a demodulated signal, like a DC voltage, to the comparator arrangements 16 based on an (alternating) receive signal.

All of the M×K comparators 16a, 16b, 16c, 16d of the receiving paths 12a, 12b and 12c are coupled to a digital selector 20. The digital selector 20 may be formed by an OR-operation unit. The digital selector 20 has the purpose of selecting or processing one or more of M×K channels and to forward the information to the output of the selector.

As illustrated, each comparator 16a to 16d of the M receiving paths 12a, 12b or 12c may optionally be coupled to the digital selector 20 via a correlator 22a, 22b, 22c and 22d (correlator arrangement 22). The optional correlators 22a, 22b, 22c and 22d, e.g. an XNOR and/or XOR based digital correlator, are configured to detect the bit sequence having a predetermined pattern and the output pattern by the respective comparator 16a, 16b, 16c or 16d and to forward the bit sequence or to output a signal based on the bit sequence to the digital selector 20. That is, each correlator 22a, 22b, 22c or 22d indicates certain code match due to the corresponding comparator data. For example, good correlation results can be achieved for a sequence length of N=31

If the modulated data is suitable correlating code and all of the correlators 22a, 22b, 22c and 22d of the receiving paths 12a, 12b and 12c scan the same code sequence, each correlator 22a to 22d indicates a certain code match due to the corresponding comparator data. The matching is shown by the following table, which is substantially equal to the table 3 shown above.

Figure 2B:
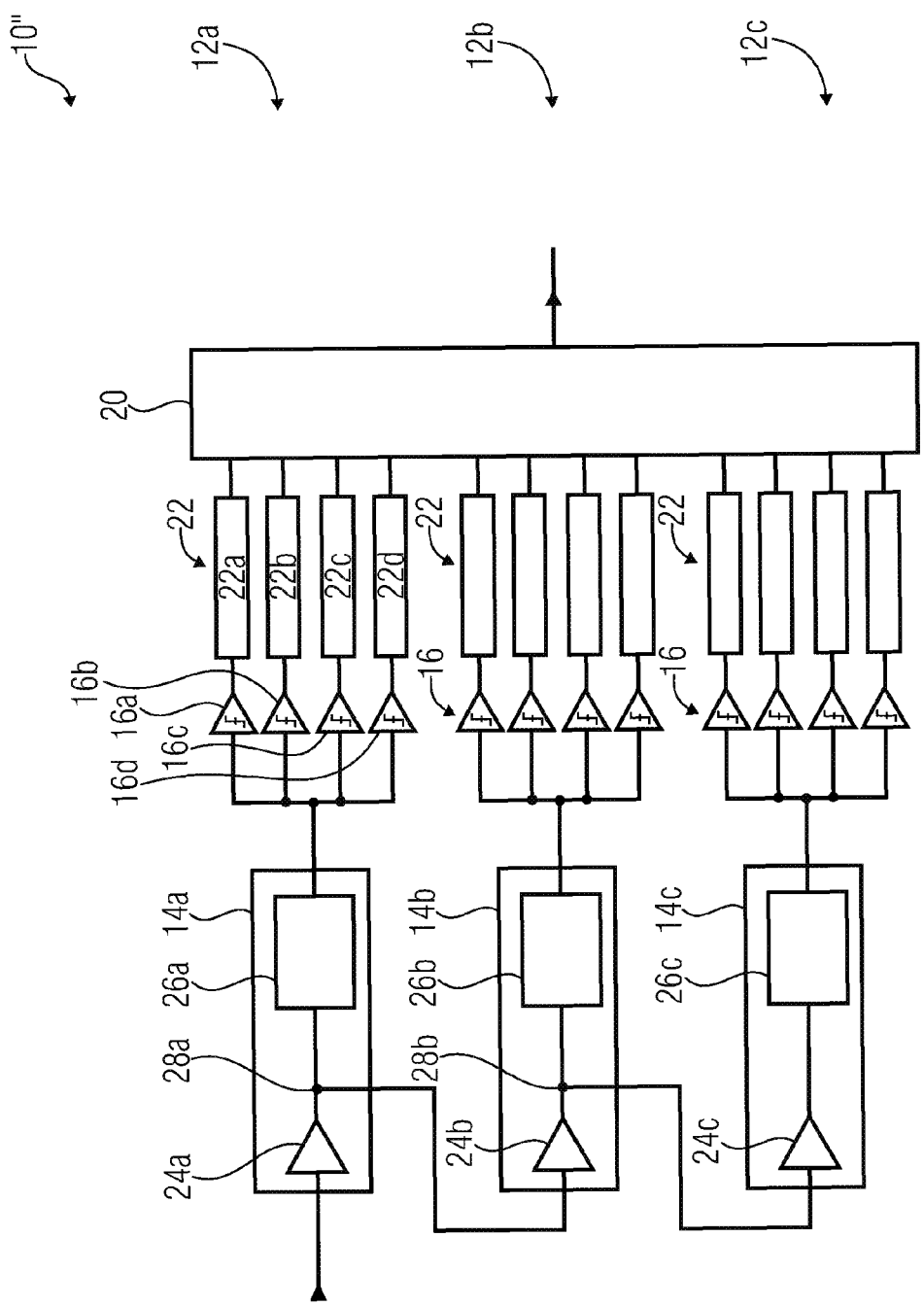
FIG. 2*b* shows a schematic block diagram of a receiving stage according to a further embodiment, wherein the M receiving paths are partially arranged in series.

FIG. 2b shows a further receiving stage 10" comprising the M receiving paths 12a, 12b and 12c, wherein each receiving path comprises the comparator arrangement 16 coupled via the correlators 22a, 22b, 22c and 22d to the digital selector 20. In contrast to the embodiment of FIG. 2a, the M receiving paths 12a, 12b and 12c are not coupled to a common node, but partially coupled in series.

Here, the second receiving path 12b is coupled to the first receiving path 12a via a first tapping 28a at the output of the amplifier 24a of the first signal processor 14a, i.e. that the tapping 28a is arranged between the amplifier 24a and the optional demodulator 26a. Analogously, the signal processor 14c of the last receiving path 12c is coupled to the output of the amplifier 24b of the previous receiving path 12b via a tapping 28b. Thus, the signal amplified by the second amplifier 24b of the second receiving path 12b is pre-amplified by the first amplifier 24a of the first receiving path 12a, wherein the signal amplified by the amplifier 24c is pre-amplified by the amplifiers 24b and 24a of the previous receiving paths 12a and 12b. Consequently, the amplification gains increase from the first receiving path 12a to the last receiving path 12c, although the gains of the amplifiers 24a, 24b and 24c may be equal or may be selected arbitrarily.

Figure 3A:
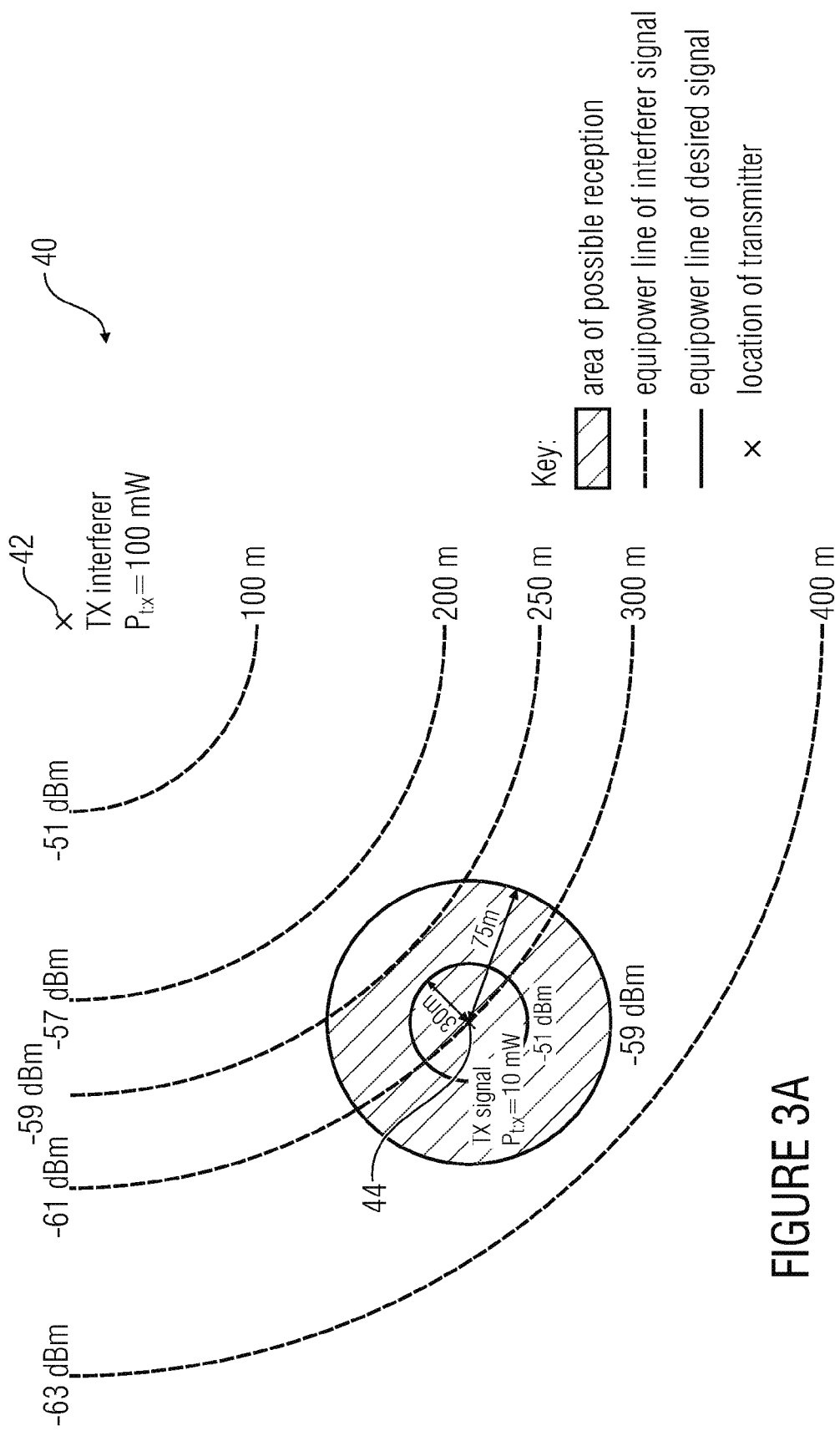
FIG. 3*a* shows an exemplary scenario for receiving a receive signal in order to illustrate the improvements achieved by the present invention.

FIG. 3a shows a reception map 40 illustrating the signal strength for a receiver 44 comprising one of the receiving stages 10, 10' or 10", wherein the TX signal is disturbed by an interferer 42. The emitted power of the interferer 42 is 100 mW. The desired signal is emitted with 10 mW. The distance between the two signal sources is 300 m (cf. broken line). The desired circle arcs represent the equipower lines of the interferer 42 meaning that the power of the interferer signal equals an annotated value, for all points on the arc. The hatched area represents the location in which the signal level is larger than

TABLE 4

| data modulated desired IF signal [dBV] | CW interferer signal [dBV] | effective IF signal [dBV] for data = 1 | simple OOK"-60" correlator output | \multicolumn{12}{c}{Correlator outputs (M for code match)} | output at "digital selector" e.g. logical OR |
|---|---|---|---|---|---|---|---|---|---|---|---|---|---|---|---|---|
| | | | | 3.4 | 3.3 | 3.2 | 3.1 | 2.4 | 2.3 | 2.2 | 2.1 | 1.4 | 1.3 | 1.2 | 1.1 | |
| −40 | −30 | −29.6 | — | — | — | — | — | — | — | — | — | — | — | — | — | 0 |
| −40 | −40 | −37 | — | — | — | — | — | — | — | — | — | — | — | — | — | 0 |
| −40 | −50 | −39.6 | — | — | — | — | — | — | — | — | — | — | M | M | M | 1 |
| −50 | −40 | −39.6 | — | — | — | — | — | — | — | — | — | — | — | — | — | 0 |
| −50 | −50 | −47 | — | — | — | — | — | — | — | — | — | — | M | — | — | 1 |
| −50 | −60 | −49.6 | — | — | — | — | — | — | M | M | M | M | — | — | — | 1 |
| −60 | −50 | −49.6 | — | — | — | — | — | — | — | — | — | — | — | — | — | 0 |
| −60 | −60 | −57 | — | — | — | — | — | — | — | M | — | — | — | — | — | 1 |
| −60 | −70 | −59.6 | M | — | M | M | M | M | — | — | — | — | — | — | — | 1 |
| −70 | −60 | −59.6 | — | — | — | — | — | — | — | — | — | — | — | — | — | 0 |
| −70 | −70 | −67 | — | M | M | — | — | — | — | — | — | — | — | — | — | 1 |
| −70 | −80 | −69.6 | — | M | — | — | — | — | — | — | — | — | — | — | — | 1 |

For each scenario the output at the digital selector 20 is shown, wherein 1 at the output at the digital selector 20 means code match achieved and 0 means no code match achieved. Comparing the simple OOK correlator output (using only one comparator and one correlator) with the e.g. ORed correlator output signals, a strong improvement can be observed. Seven signal scenarios can be met by the proposed architecture. In contrary, a simple OOK receiver with a single comparator and a single correlator only meets one of the scenarios. In other words the higher input dynamic range leads to substantial improvement of interferer immunity. It should be noted that it is useful to use spread sequence modulation IF signals to distinguish the modulated interferer and the data modulated signals in the correlator.

the interferer level in the given scenario. Within the signal equipower line of −51 dBm (at a distance of 30 m) the signal to interferer ratio (CIR) is larger than 10 dB and decreases with increasing distance.

The proposed architecture of the receiving stages 10, 10' or 10" allows reception with low signal to interferer ratio (e.g. 3 dB), when using OOK modulated data on the receive signal. This means near field (e.g. 50 to 60 m) reception of short data telegrams is possible in presence of a strong interferer. In the case of a state-of-the-art receiver with AGC, a short data telegram would have to be repeated several times, until the feedback loop locks the IF signal onto proper reception/sensing level for a comparator. With the proposed method there is no delay due to gain adjust and no telegram is missed. Assuming for comparison that an OOK receiver with a sensitivity of −80 dBm, having neither AGC nor the above M×K-matrix, located 3 km away (100 dB path loss) from the above interferer source would still be blocked by the interferer.

Figure 3B:
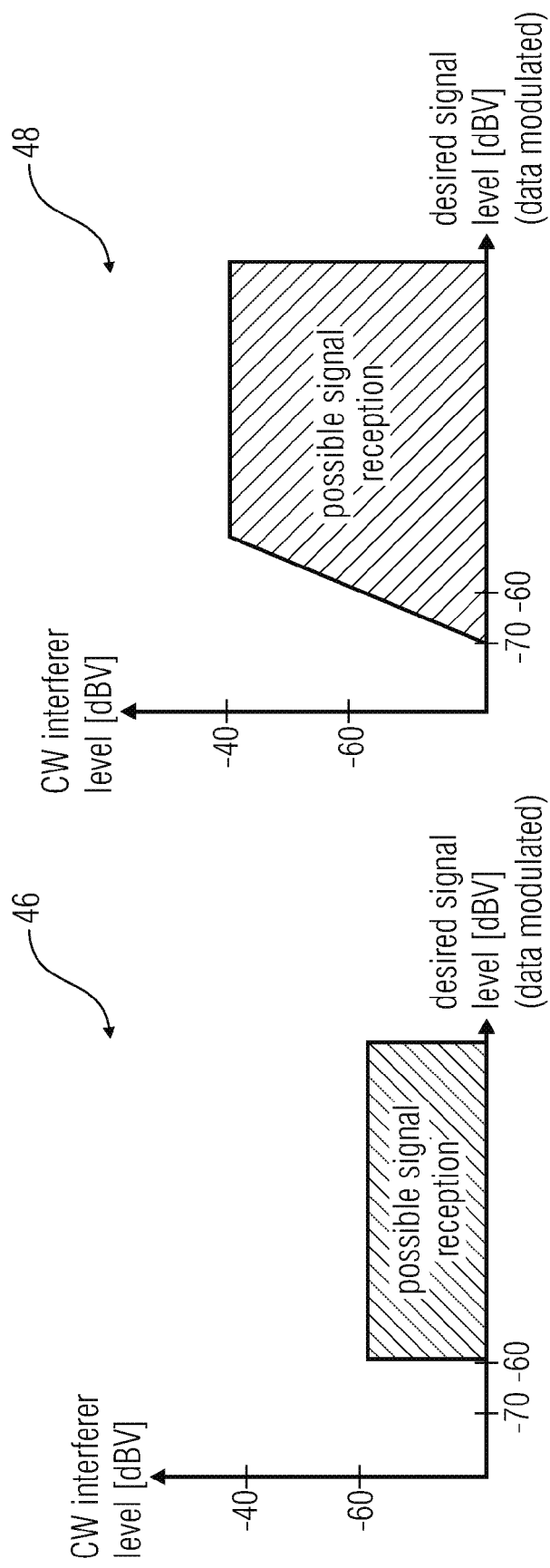
FIG. 3*b* shows two diagrams for illustrating the improvements of the present invention.

FIG. 3b shows two diagrams 46 and 48 in which the possible signal reception is marked dependent on the CW signal level (CW interferer level) and the data signal level (desired signal level). In each diagram the CW signal level is plotted over the data signal level. The first diagram 46 illustrates the possible signal reception (hatched area) for a simple OOK correlating receiver (using one comparator and one correlator). The second diagram 48 illustrates the possible signal reception for a receiver (cf. 10, 10' and 10") having an extended dynamic range using multiple comparators and correlators. The comparison with the two diagrams 46 and 48 regarding the CW signal level shows that a receiver 10, 10' and 10" having the improved receiving stage is able to receive a signal up to a CW signal level which is higher when compared to the state of the art approach.

Furthermore, regarding the desired signal level it should be noted that the desired signal level, by using the improved receiving stages, may be smaller (cf. data signal level: −70 dBV point) in case of low interference.

Although in above embodiments the receivers 10, 10' and 10" are explained as receivers having three receiving paths 12a, 12b and 12c with four comparators 16a, 16b, 16c and 16d, it should be noted that the number M of the receiving paths as well as the number K of the comparators may vary.

In general, it should be noted that the difference between two successive amplification gains of the plurality of receiving paths 12a, 12b and 12c are advantageously equidistant. For example, the difference between two successive amplification gains may be 10 of 15 dB.

Although in above embodiments, the threshold values have been discussed as pressure values which equal for each of the M comparator arrangements 16, it should be noted that the pressure values may, alternatively, vary from the first receiving path 12a to the last receiving paths 12c.

Referring to FIGS. 2a and 2b it should be noted that the outputs of the M×K comparators may be used to perform an occupancy estimation of the RF channel.

Although some aspects have also been described in the context of an apparatus, it is clear that the aspects also represent a description of the corresponding method, where a block or a device corresponds to a method step or a feature of the method step. Analogously, aspects described in the context of the method step also represent the description of a corresponding block, item or feature of the corresponding apparatus. Some or all of the method steps may be executed by (or using) a hardware apparatus, like a microprocessor, programmable computer or an electronic circuit. In some embodiments, some one or more of the most important method steps may be executed by such an apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Receiving stage for receiving a radio frequency signal, comprising:
M receiving paths, each receiving path comprising a signal processor and K comparators,
wherein the signal processors of the M receiving paths are configured to generate, for each of the M receiving paths, an amplified version of the radio frequency signal such that an amplification gain of the respective receiving path increases from a first of the M receiving paths to a last of the M receiving paths,
wherein for each of the M receiving paths the K comparators of the respective receiving paths are configured to compare the amplified radio frequency signal of the respective receiving path with a respective threshold value, and for each of the M receiving paths the threshold value increases from a first of the K comparators to the last of the K comparators.

2. Receiving stage according to claim 1, wherein the M receiving paths are arranged in parallel and coupled to a common node at its input side.

3. Receiving stage according to claim 2, wherein the respective signal processors of the M receiving paths comprise different gains.

4. Receiving stage according to claim 1, wherein each signal processor of the M receiving paths comprises an amplifier.

5. Receiving stage according to claim 4, wherein each signal processor of the M receiving paths comprises a demodulator arranged between the respective amplifier and the K comparators.

6. Receiving stage according to claim 5, wherein the demodulator comprises a peak detector, power detector, envelope detector and/or a detector for demodulating an amplitude modulator signal.

7. Receiving stage according to claim 1, wherein the signal processors of the M receiving paths are arranged in series and wherein the K comparators of the M receiving paths are arranged in parallel.

8. Receiving stage according to claim 7, wherein each signal processor of the M receiving paths comprises an amplifier and wherein the gains of the respective amplifiers of the M receiving paths are equal so that at least the amplification gain of the last of the M receiving paths is based on a combination of the gain of the amplifier of the first of the M receiving paths and the gain of the amplifier of the last of the M receiving paths.

9. Receiving stage according to claim 8, wherein each signal processor of the M receiving paths comprises an amplifier and a demodulator arranged between the amplifier and the K comparators, wherein for each of the M receiving paths a tapping for the next of the M receiving paths is arranged between the respective amplifier and the respective demodulator.

10. Receiving stage according to claim 1, wherein the K comparators are arranged in parallel and coupled to the respective signal processor via a common node.

11. Receiving stage according to claim 1, wherein each of the K comparators is coupled to a correlator unit configured to detect a bit sequence forwarded by the respective comparator.

12. Receiving stage according to claim 11, wherein the K comparators are configured to forward the amplified radio frequency signal, if the amplified radio frequency signal is above a respective threshold value and if a difference between the amplified radio frequency signal and an interfering signal is larger than an average distance of the K threshold values, wherein the radio frequency signal comprises the interfering signal and a data signal carrying the bit sequence.

13. Receiving stage according to claim 11, wherein the respective correlator comprises an XNOR-operator unit or XOR-operator unit.

14. Receiving stage according to claim 11, wherein each correlator of the M receiving path is coupled to a digital selector configured to output information based on the bit sequence detected by one of the K correlators.

15. Receiving stage according to claim 14, wherein the digital selector comprises a combinational logic for selecting and/or processing one or more of M×K channels, each channel is formed by the respective correlator of the M receiving path.

16. Receiving stage according to claim 14, wherein the digital selector is configured to output information on the respective correlator in which the bit sequence is detected.

17. Receiving stage according to claim 1, wherein the M−1 differences between two successive amplification gains of the M amplification gains are equidistant.

18. Receiving stage according to claim 17, wherein an average distance between the K threshold values is at least two times smaller than the difference between two successive amplification gains.

19. Receiving stage according to claim 1, wherein each receiving path comprises a plurality of K comparators which are arranged in parallel and coupled to the respective signal processor via a common node.

20. Receiving stage according to claim 1, wherein the radio frequency signal comprises a bit sequence.

21. Receiving stage according to claim 1, wherein the receiving stage comprises at least three receiving paths.

22. Method for receiving a radio frequency signal, using a receiving stage comprising M receiving paths, each receiving path comprises a signal processor and K comparators, the method comprising:
generating an amplified version of the radio frequency signal for each of the M receiving paths, using the respective signal processor of the average receiving path, such that an amplification gain of the respective receiving paths increases from a first of the averaging path to a last of the receiving paths; and
comparing the amplified radio frequency signal of the respective receiving paths with a respective threshold value for each of the M receiving paths, using the K comparators of the respective receiving paths, wherein for each of the receiving paths the threshold value increases from a first of the K comparators to a last of the K comparators.

\* \* \* \* \*